United States Patent [19]
Dutta et al.

[11] Patent Number: 5,631,490
[45] Date of Patent: May 20, 1997

[54] METAL SEMICONDUCTOR METAL PHOTODETECTORS

[75] Inventors: Niloy K. Dutta, Annandale; Dale C. Jacobson, Allamuchy; Doyle T. Nichols, Stirling, all of N.J.

[73] Assignee: Lucent Technologies Inc., Murray Hill, N.J.

[21] Appl. No.: 371,247

[22] Filed: Jan. 11, 1995

[51] Int. Cl.$^6$ ................................................. H01L 27/14
[52] U.S. Cl. ........................... 257/457; 257/459; 257/439
[58] Field of Search ........................................ 257/453, 457, 257/454, 455, 456, 459, 439

[56] References Cited

U.S. PATENT DOCUMENTS

| | | | |
|---|---|---|---|
| 4,626,322 | 12/1986 | Switzer | 204/2.1 |
| 4,772,931 | 9/1988 | Rogers et al. | 357/30 |
| 4,807,006 | 2/1989 | Rogers et al. | 357/30 |
| 5,451,769 | 9/1995 | Mc Adoo et al. | 257/457 |
| 5,461,246 | 10/1995 | Chou | 257/449 |

FOREIGN PATENT DOCUMENTS

| | | | |
|---|---|---|---|
| 55-53466 | 4/1980 | Japan | 257/457 |
| 5-75101 | 3/1983 | Japan | 257/453 |

*Primary Examiner*—Donald L. Monin, Jr.

[57] ABSTRACT

MSM-photodetectors are produced using implanted n-type Si and interdigitated electrodes deposited on the implanted surface. The implantation process decreases the carrier lifetime by several orders of magnitude. By implanting silicon with fluorine or oxygen, the bandwidth is increased relatively to unimplanted MSM photodetectors. Exemplary implanted photodetectors exhibited 3-dB bandwidths which were faster by an order of magnitude compared to their unimplanted counterparts. The detectors are thus compatible with multi-gigabit per second operation and monolithic integration with silicon electronics.

5 Claims, 2 Drawing Sheets

METAL SEMICONDUCTOR METAL PHOTODETECTORS

FIELD OF THE INVENTION

This invention concerns silicon metal-semiconductor-metal photodetectors.

BACKGROUND OF THE INVENTION

The monolithic integration of a photodetector with silicon electronics is very attractive from the standpoints of cost and yield. Monolithically integrated silicon receivers, that is silicon photodiodes, on the same chip as CMOS circuits, is an attractive alternative to hybrid receivers, e.g., InGaAs photodiodes bonded to CMOS or GaAs circuits. The monolithically integrated receivers can be fabricated using the standard silicon processes and therefore are expected to be of lower cost than the hybrid designs. Metal-semiconductor-metal (MSM) photodiodes offer planarity and compatibility with silicon Very Large Scale Integration (VLSI). However, Si photodetectors have typically slow response due to long carrier life (~1–10 µs) and low absorption coefficient (~10–100/cm) of light.

SUMMARY OF THE INVENTION

This invention embodies MSM photodetectors fabricated on a silicon substrate. The MSM photodiodes are produced using implanted n-type Si and interdigitated electrodes. The implantation process decreases the carrier lifetime by several orders of magnitude and increases the absorption coefficient at photon energies lower than band gap of Si. By implanting silicon with such ions as fluorine or oxygen, the bandwidth is increased relative to unimplanted MSM photodetectors. The implanted detectors exhibited 3-dB bandwidths which were faster by an order of magnitude compared to their unimplanted counterparts. The detectors are thus compatible with multi-gigabit per second operation and monolithic integration with silicon electronics.

DETAILED DESCRIPTION

Figure 1:
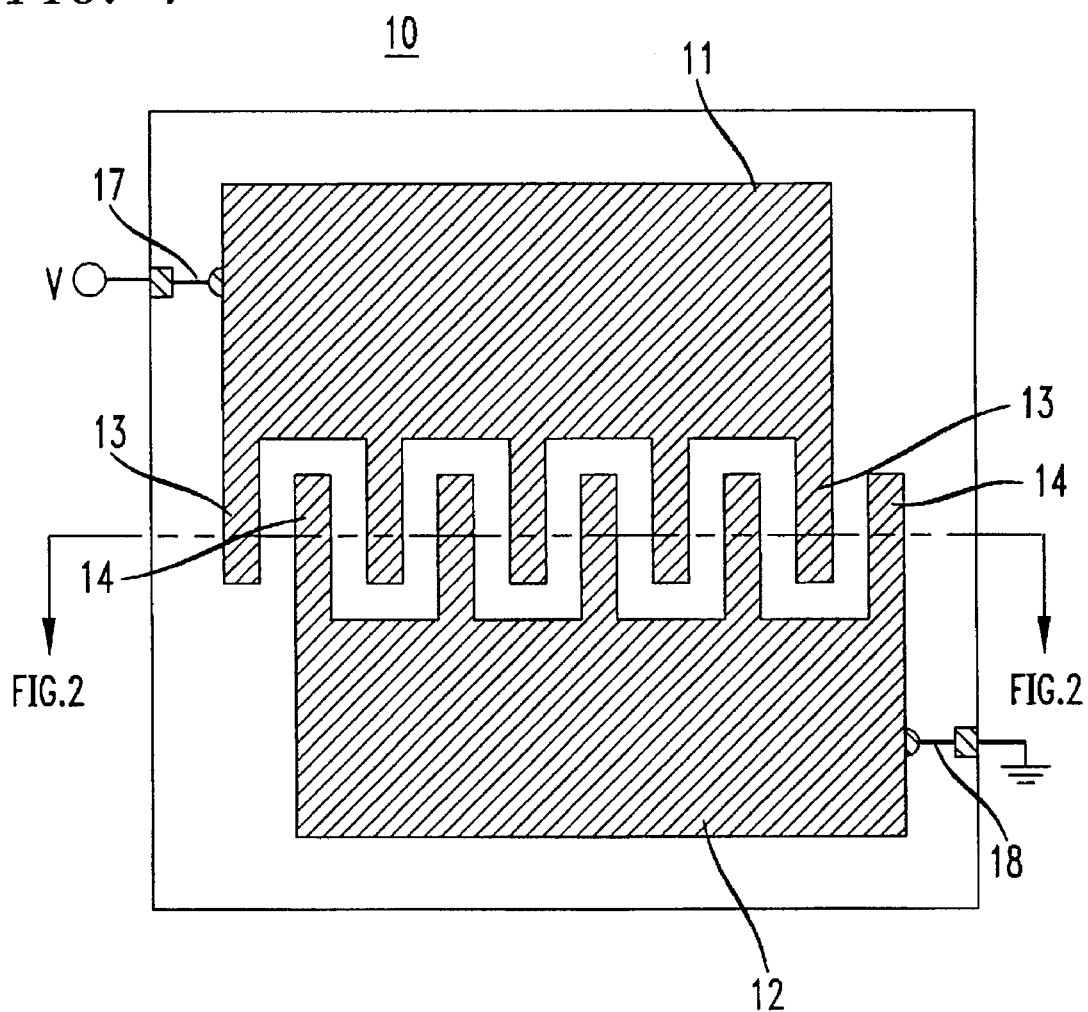
FIG. 1 is a top view of an MSM-photodetector.
Figure 2:
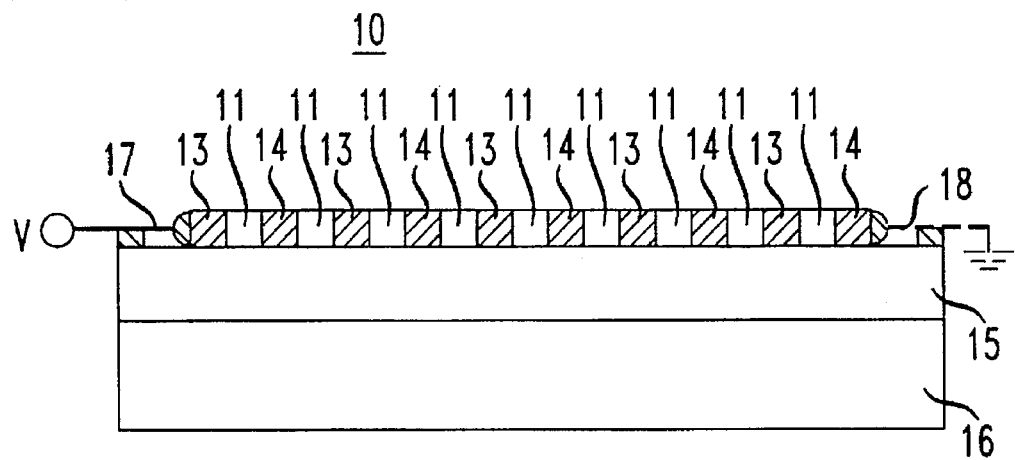
FIG. 2 is a side view, in cross-section, of the MSM photodetector taken along line 2—2 in FIG. 1.

In FIG. 1 is shown a top view of an MSM photodetector, 10. In FIG. 2 is shown a side view, in cross-section, of the MSM photodetector, taken along line 2—2 in FIG. 1.

The MSM photodetector embodying the invention includes a pair of metal contacts, 11 and 12, having interdigitated electrodes, 13 and 14, respectively. All electrodes on one contact, e.g. 11, are denoted by the same number (13) while electrodes on another contact, e.g. 12, are denoted by the same different number (14). The contacts are on top of a silicon surface, 15, implanted with ions into the surface of a silicon substrate, 16. One of the contacts, e.g. 11, is bias connected via a lead, 17, to a source of voltage (not shown), while the other of the contacts, e.g. 13, is connected via a lead, 18, to ground.

An exemplary embodiment of the MSM photodetector is constructed as follows:

An n-type Si wafer with a carrier concentration of $5 \times 10^{16}$ cm$^{-3}$ was diced into 2 cm.×3 cm. pieces and implanted with ions selected to result in the decrease of the carrier lifetime and increase in the absorption coefficient. In the exemplary embodiment, silicon substrate was implanted with $^{19}$F+ ions with an energy of 280 keV which have a range of approximately 5300 Å and a straggle of 1200 Å. Four different doses of $10^{12}$, $10^{13}$, $10^{14}$ and $10^{15}$ cm$^{-2}$ were employed along with one unimplanted control sample. Subsequently, interdigitated metal-semiconductor-metal (MSM) diodes were formed by depositing Ni/Ti (500 Å/500 Å) Schottky contacts 11 and 12 via electron beam evaporation and patterning of the interdigitated electrodes 13 and 14 via a standard photolithographic liftoff technique. The electrodes were formed with spacings, 19, between the electrodes being 1, 1.5 and 2 µm with electrode widths being identical to the inter-electrode distance. This means that 50 per cent of the detector area was available for exposure to an incident radiation. SiO$_2$ was then deposited on top of the contacts, the electrodes and open implanted areas of the silicon surface, using plasma enhanced chemical vapor deposition (PECVD). The oxide was deposited at 200° C. so as to cause a mild annealing of the implant. SiO$_2$ is deposited in a thickness ranging from 1000 to 5000 Å, with 3000 Å being preferable. The oxide was then patterned via reactive ion etching (RIE) and interconnect metallization leads 17 and 18 consisting of Ti/Au (100 A/1000 A) were deposited on the implanted silicon surface. The interconnect metallizations were designed so that the devices were compatible with high-speed on-wafer probing.

DC electrical characteristics of the detectors were measured. Typical values of the dark current for the MSM photodiodes were of order 10 nA at a bias of 5 V. The dark current does not appear to be a strong function of the implant dose. To measure the responsivity of the photodiode to radiation impinging on the area between the electrodes, an AlGaAs diode laser with an emission wavelength of 670 nm was coupled into a single mode optical fiber. The output of the fiber was then coupled to the photodetector with 2 µm electrode spacing. Approximately 300 µW of optical power was incident on the photodetector. The internal quantum efficiency as a function of implant dose is shown in Table 1. The unimplanted detectors exhibit efficiencies of 60 per cent and the efficiency decreases monotonically with increasing dose of ion implantation to a value of about 10 per cent for detectors which were implanted with a dose of $10^{15}$ cm$^{-2}$.

TABLE I

| Implant dose (cm$^{-2}$) | Internal Quantum Efficiency |
| --- | --- |
| 0 | 0.59 |
| $10^{12}$ | 0.19 |
| $10^{13}$ | 0.19 |
| $10^{14}$ | 0.10 |
| $10^{15}$ | 0.09 |

Figure 3:
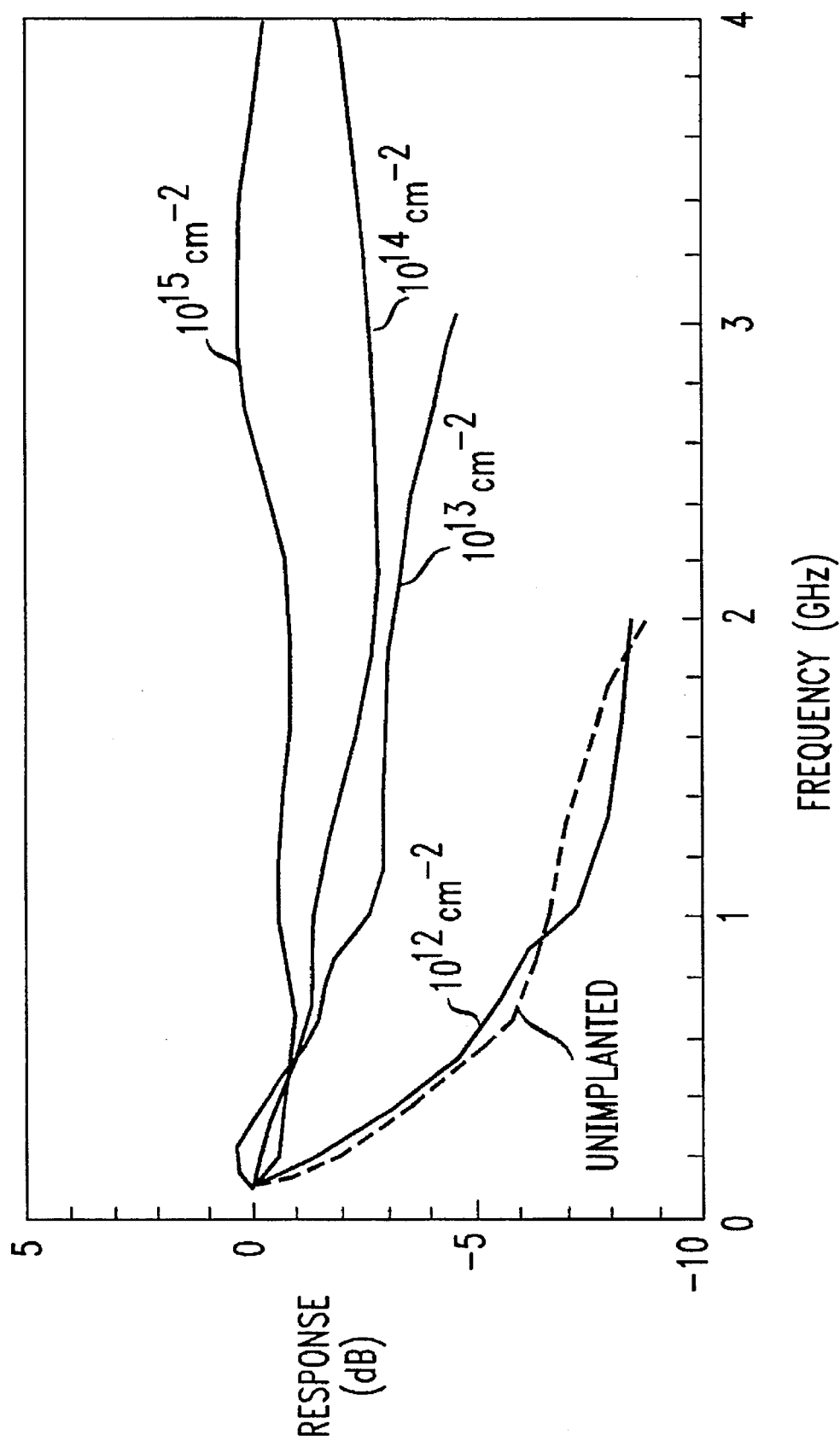
FIG. 3 are plots of frequency response for MSM photodetectors fabricated with different implantation doses.

In order to investigate the high-speed characteristics of the photodetectors, the AlGaAs diode laser was connected through a high-frequency bias network to an electrical output of an optical component analyzer which has a measurement capability between 130 MHz and 20 GHz. The frequency response of the laser was measured using a fast p-i-n diode, the output of which was connected to the electrical input of the analyzer. The modulated optical output of the laser was then focused onto the MSM photodetectors with 1 µm inter-electrode spacing. The reason for the selection of 1 µm inter-electrode spacing, and not the 2 µm spacing, is for maximization of the bandwidth which is approximately inversely proportional to interelectrode spacing. Frequency response characteristics of the photodetectors were then evaluated by subtracting the laser response (in dB) from the laser and photodetector response. The measured frequency response for the photodetectors with various implantation doses is shown in FIG. 3. The modulation bandwidth of the photodetectors was observed to be a monotonically increasing function of the implant dose. The bandwidths ranged from approximately 300 MHz for the unimplanted devices, to greater than 4 GHz for the devices implanted with doses of $10^{14}$ and $10^{15}$ cm$^{-2}$. Existing measurement system prevented measurements at frequencies larger than 4 GHz. However, it is expected that the bandwidth will be between 6 and 10 GHz. The DC and high-frequency data indicate that substantial decreases in the carrier lifetimes are brought about by ion implantation, allowing for at least an order of magnitude increase in the measured microwave bandwidth of the photodetectors relative to unimplanted photodetectors. This experiment shows that photodetectors have been fabricated which can be operated at data rates of several gigabits per second. Even better performance is expected with optimization.

We claim:

1. A metal-semiconductor-metal photodiode which comprises a silicon substrate and a pair of spaced metal contacts on an upper surface of the silicon substrate, wherein said upper surface is implanted with ions selected to decrease carrier lifetime and to increase the absorption coefficient of the silicon substrate, each of said contacts has a plurality of electrodes projecting laterally toward another of said contacts, said electrodes being interdigitated each relative to another, the spacing between adjacent electrodes and between the electrodes and the opposing contacts being identical, and the width of the electrodes being identical to the said spacing.

2. The MSM photodiode of claim 1, in which said silicon is an n-type silicon with a carrier concentration of $5\times10^{16}$ cm$^{-3}$.

3. The MSM photodiode of claim 2, in which said ions are $^{19}$F+ ions or oxygen ions.

4. The MSM photodiode of claim 3, in which the implantation dose ranges from $10^{12}$ cm$^{-2}$ to $10^{15}$ cm$^{-2}$.

5. The MSM photodiode of claim 1, in which said contacts are Ni/Ti Schottky contacts.

* * * * *